(12) United States Patent
Farmer (10) Patent No.: US 6,907,051 B1
(45) Date of Patent: Jun. 14, 2005

(54) DYNAMICALLY SPECTRALLY TAILORED RAMAN PUMP LASER

(75) Inventor: Jason N. Farmer, Seattle, WA (US)

(73) Assignee: nLight Photonics Corporation, Seattle, WA (US)

( * ) Notice: Subject to any disclaimer, the term of this patent is extended or adjusted under 35 U.S.C. 154(b) by 244 days.

(21) Appl. No.: 09/945,370

(22) Filed: Aug. 31, 2001

(51) Int. Cl.$^7$ .............................. H01S 3/30; H01S 3/13; H01S 3/00
(52) U.S. Cl. .................. 372/3; 372/29.01; 372/29.015; 372/38.1; 372/38.02; 372/29.021
(58) Field of Search ..................... 372/3, 29.01, 29.011, 372/29.015, 29.021, 38.1, 38.01, 38.02, 38.06, 9, 6, 23, 43, 68, 99, 101, 29.02, 38.07, 102, 108

(56) References Cited

U.S. PATENT DOCUMENTS

| | | | |
|---|---|---|---|
| 4,699,452 A | 10/1987 | Mollenauer et al. | |
| 4,881,790 A | 11/1989 | Mollenauer et al. | |
| 4,923,270 A | 5/1990 | Carter | |
| 5,115,444 A | 5/1992 | Kirkby et al. | |
| 5,163,058 A | 11/1992 | Farries et al. | |
| 5,319,668 A | 6/1994 | Luecke | |
| 5,351,262 A | 9/1994 | Poguntke et al. | |
| 5,386,426 A | 1/1995 | Stephens | |
| 5,510,920 A | 4/1996 | Ota | |
| 5,528,612 A | 6/1996 | Scheps et al. | |
| 5,570,226 A | 10/1996 | Ota | |
| 5,773,345 A | 6/1998 | Ota | |
| 5,894,362 A | * 4/1999 | Onaka et al. | 398/95 |
| 6,052,394 A | 4/2000 | Lee et al. | |
| 6,130,899 A | 10/2000 | Epworth et al. | |
| 6,456,756 B1 | * 9/2002 | Mead et al. | 385/24 |
| 6,570,704 B2 | * 5/2003 | Palese | 359/349 |

FOREIGN PATENT DOCUMENTS

JP        62-229891        10/1987

OTHER PUBLICATIONS

Mermelstein et al. "Configurable Three–Wavelength Raman Fiber Laser for Raman Amplification and Dynamic Gain Flattening." IEEE Photonics Technology Letters, 1041–1135/01. pp. 1–3.

* cited by examiner

*Primary Examiner*—Minsun Oh Harvey
*Assistant Examiner*—Armando Rodriguez
(74) *Attorney, Agent, or Firm*—Fulbright & Jaworski LLP (57) ABSTRACT

The present invention is directed to a system and method which provide a Raman pump which is spectrally tailored in response to feedback from control structure associated with the Raman pump source. In certain embodiments of the present inventions, an incoherently beam combined laser (IBC) is utilized to provide a spectrally tailored Raman pump. In these embodiments, emitters in an emitter array are either individually addressable or block addressable to facilitate adjustment of emitter output power. By adjustment of the output power, the Raman pump may be spectrally tailored. The spectral tailoring can occur by employing suitable control algorithms to algorithms to dynamically maintain reasonably flat Raman gain.

24 Claims, 4 Drawing Sheets

DYNAMICALLY SPECTRALLY TAILORED RAMAN PUMP LASER

CROSS-REFERENCE TO RELATED APPLICATIONS

The application is related to co-pending and commonly assigned U.S. patent application Ser. No. 09/945,381, filed Aug. 31, 2001, entitled "SYSTEM AND METHOD FOR PROVIDING A SPECTRALLY TAILORED RAMAN PUMP," which is incorporated herein by reference.

BACKGROUND OF THE INVENTION

At the present time, telecommunication systems are largely based on fiber optic cables. For example, optical networks based on fiber optic cables are currently utilized to transport Internet traffic and traditional telephony information. In such applications, it is frequently necessary to provide an optical signal over significant distances (e.g., hundreds to thousands of kilometers). As optical signals travel through the optical fibers, a portion of their power is transferred to the fiber, scattered, or otherwise lost. Over appreciable distances, the optical signals become significantly attenuated. To address the attenuation, optical signals are amplified. Typical optical amplifiers include rare earth doped amplifiers (e.g., Erbiumdoped fiber amplifiers).

Also, Raman amplifiers may be utilized. A Raman amplifier relies upon the Raman scattering effect. The Raman scattering effect is a process in which light is frequency downshifted in a material. The frequency downshift results from a nonlinear interaction between light and the material. The difference in frequency between the input light and the frequency downshifted light is referred to as the Stokes shift which in silica fibers is of the order 13 THz.

When photons of two different wavelengths are present in an optical fiber, Raman scattering effect can be stimulated. This process is referred to as stimulated Raman scattering (SRS). In the SRS process, longer wavelength photons stimulate shorter wavelength photons to experience a Raman scattering event. The shorter wavelength photons are destroyed and longer wavelength photons, identical to the longer wavelength photons present initially, are created. The excess energy is conserved as an optical phonon (a lattice vibration). This process results in an increase in the number of longer wavelength photons and is referred to as Raman gain.

The probability that a Raman scattering event will occur is dependent on the intensity of the light as well as the wavelength separation between the two photons. The interaction between two optical waves due to SRS is governed by the following set of coupled equations:

$$\frac{dI_P}{dz} = \frac{\lambda_S}{\lambda_P} g_R I_S I_P - \alpha_P I_P$$

$$\frac{dI_S}{dz} = g_R I_S I_P - \alpha_S I_S$$

where $I_s$ is the intensity of the signal light (longer wavelength), $I_p$ is the intensity of the pump light (shorter wavelength), $g_R$ is the Raman gain coefficient, $\lambda_s$ is the signal wavelength, $\lambda_p$ is the pump wavelength, and $\alpha_s$ and $\alpha_p$ are the fiber attenuation coefficients at the signal and pump wavelengths respectively. The Raman gain coefficient, $g_R$, is dependent on the wavelength difference $(\lambda_s - \lambda_p)$ as is well known in the art.

As is well understood in the art, SRS is useful for generating optical gain. Optical amplifiers based on Raman gain are viewed as promising technology for amplification of WDM and DWDM telecommunication signals transmitted on optical fibers. Until recently, Raman amplifiers have not attracted much commercial interest because significant optical gain requires approximately one watt of optical pump power. Lasers capable of producing these powers at the wavelengths appropriate for Raman amplifiers have come into existence only over the past few years. These advances have renewed interest in Raman amplifiers.

Figure 1:
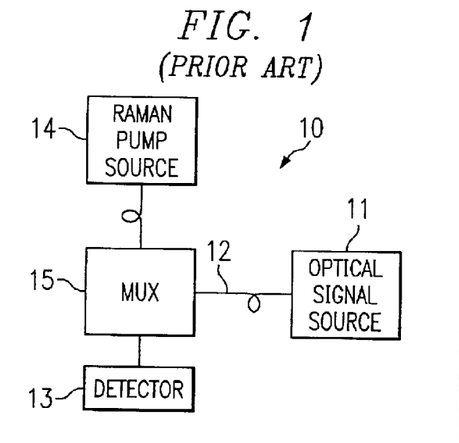
FIG. 1 depicts an optical communication system including a Raman amplifier according to the prior art.

FIG. 1 depicts an exemplary prior art arrangement of optical system 10 which includes a Raman amplifier. Optical system 10 includes optical signal source 11 which launches an optical signal into optical fiber 12 to be communicated to detector 13. Detector 13 is disposed an appreciable distance away from optical signal source 11. Accordingly, optical amplification is required due to attenuation in optical fiber 12. Raman pump source 14 provides a Raman pump to multiplexer 15. Multiplexer 15 provides the Raman pump to optical fiber 12 to generate the desired optical gain.

A key performance parameter of Raman amplifiers is the gain flatness of the amplifier. Gain flatness can be quantified by measuring the gain ripple (variation in gain experience by the optical channels) across the amplification band. To compensate for non-zero gain ripple, a gain flattening filter may be applied to the optical signal to equalize the gain between channels. However, this is a non-optimal solution, since this approach adds loss and therefore decreases the signal-to-noise (SNR) ratio of the system. This becomes an issue when an optical network comprises multiple spans of fiber. Moreover, it shall be appreciated that Raman amplification may be altered by any number of factors on a time variant basis. To compensate for such differences, a gain flattening filter may be applied to the optical signal to equalize the gain between channels. However, this is a non-optimal solution, since this approach increases overall system loss. This additional loss must be compensated with increased gain which, in turn, increases the ASF noise floor and, hence, decreases the signal-to-noise (SNR) ratio of the system.

BRIEF SUMMARY OF THE INVENTION

The present invention is directed to a system and method which provide a Raman pump which is dynamically spectrally tailored in response to feedback from control structure associated with the Raman pump source. In certain embodiments of the present invention, an incoherently beam combined laser (IBC) is utilized to provide a spectrally tailored Raman pump. In these embodiments, emitters in an emitter array are either individually addressable or block addressable to facilitate adjustment of emitter output power of individual emitters of emitter blocks. By adjustment of the output power, the Raman pump is spectrally tailored. An error signal can be generated by measuring the power levels of the optical signal as the optical signal exits the amplifier. The power levels can be compared to a desired power level. By employing suitable control algorithms with this error signal, the desired gain can be maintained dynamically.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 2:
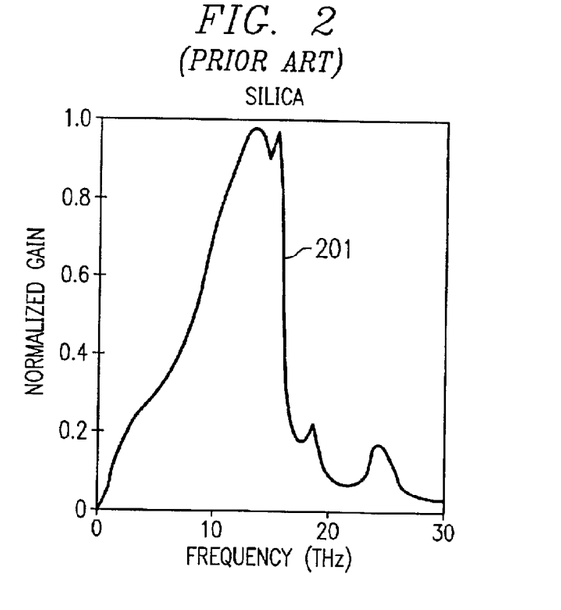
FIG. 2 depicts Raman gain profile in fused silica as is known according to the prior art.

As discussed in *Pump Interactions in 100-nm Bandwidth Raman Amplifier*, H. Kidorf et al., IEEE Photonics Technology Letters, Vol. 11, No. 5, May 1999, FIG. 2 depicts Raman gain profile 201 in fused silica. Raman gain profile 201 depicts the gain produced by a spectrally limited source (a pump wavelength of 1 micron). The peak of the Raman gain profile is shifted to the red side of the pump wavelength by the Stokes shift which is approximately 13 THz. This attribute of Raman gain profile 101 causes the Raman process to most strongly amplify wavelengths that are longer than the pump center wavelength.

It shall be appreciated that a spectrally flat Raman pump will not generate spectrally flat Raman gain. This phenomenon is caused by pump-pump interactions or self-amplification. Self-amplification causes red components (longer wavelengths) of the Raman pump to be amplified by blue components (shorter wavelengths) of the Raman pump. This, in turn, causes greater Raman gain at the red end of the spectrum. Self-amplification of a Raman pump, among other pertinent issues, is discussed by Kidorf et al. In particular, the authors provide an iterative algorithm to model the behavior of a Raman amplifier. This iterative algorithm may be utilized to determine the resultant Raman gain from a given Raman pump.

The equation that describes Raman gain from a given Raman pump spectrum is:

$$\frac{\partial I_f(z, \omega)}{dz} = -\alpha I_f(z, \omega) + \int_{<\omega} g(\omega - v)[I_f(z, \omega) + I_b(z, \omega)]dv - \int_{>\omega} g(\omega - v)[I_f(z, \omega)]dv$$

where the forward intensity, $I_f$, is a function of distance, z, along the fiber, and frequency, $\omega$. Attenuation is represented by $\alpha$, while g represents the Raman gain profile. This model includes the effects of back-propagating intensity, $I_b$, but for simplicity does not include spontaneous Raman emission or Rayleigh scattering. The actual intensities in the fiber reflect the transfer of power not only from the pumps to the signal waves, but also from the shorter-wavelength pumps to the longer-wavelength pumps.

Figure 3:
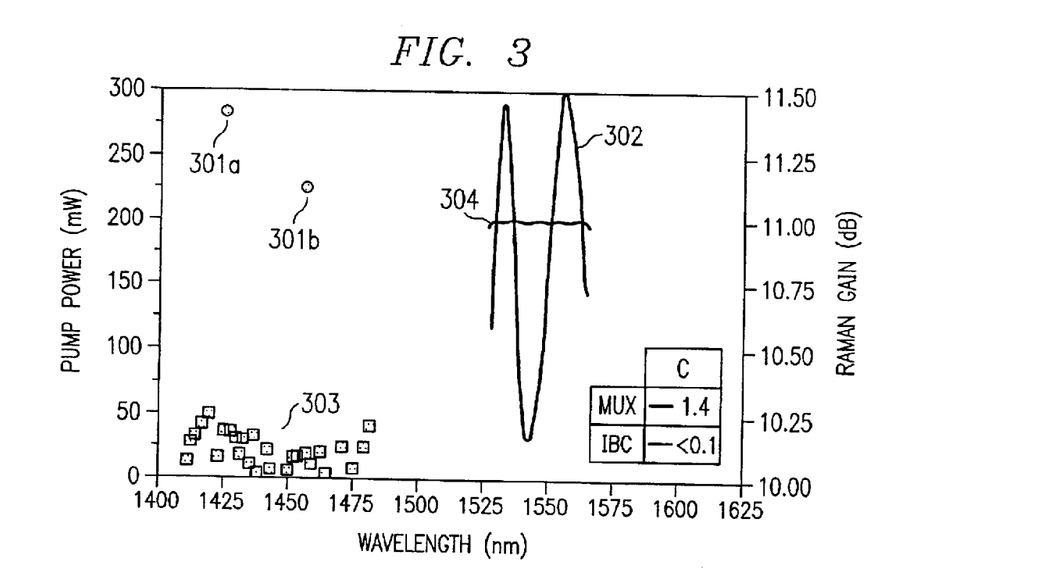
FIG. 3 depicts a Raman pump spectrum according to the prior art and a Raman pump spectrum according to an embodiment of the present invention with each of the Raman pump spectrums generating Raman gain across the C Band (1530 to 1565 nm)

FIG. 3 depicts a Raman pump spectrum (consisting of 301a and 301b) associated with the prior art and its resulting Raman gain spectrum 302. According to the prior art, the output beams from two laser sources are multiplexed to provide the Raman pump. The two laser sources operate at relatively high output powers (approximately 280 and 250 mW respectively). By providing this Raman pump spectrum (301a and 301b) to a Raman gain medium, Raman gain spectrum 302 results across the C Band (1530 to 1565 nm). Raman gain spectrum 302 exhibits relatively significant gain ripple across the C Band. Specifically, the difference between the maximum and minimum Raman gain is approximately 1.4 dB.

FIG. 3 further depicts Raman pump spectrum 303 according to an embodiment of the present invention. Raman pump spectrum 303 may be generated by varying output power from a plurality of individually addressable emitters. Each of the emitters is forced to lase at a distinct wavelength. The wavelengths of the emitters are advantageously selected such that the emitters are spaced across a relatively broad spectrum. In this case, the aggregate output spectrum spans approximately 70 nm (from approximately 1410 to 1480 nm). Each of the emitters operates at a relatively low output power (i.e. less than 50 mW). Raman gain spectrum 304 depicts the Raman gain across the C Band that results from Raman pump spectrum 303. Raman gain spectrum 304 exhibits far less gain ripple than Raman gain spectrum 302. The difference between the maximum and minimum amplification associated with Raman gain spectrum 304 is less than 0.1 dB.

Figure 4:
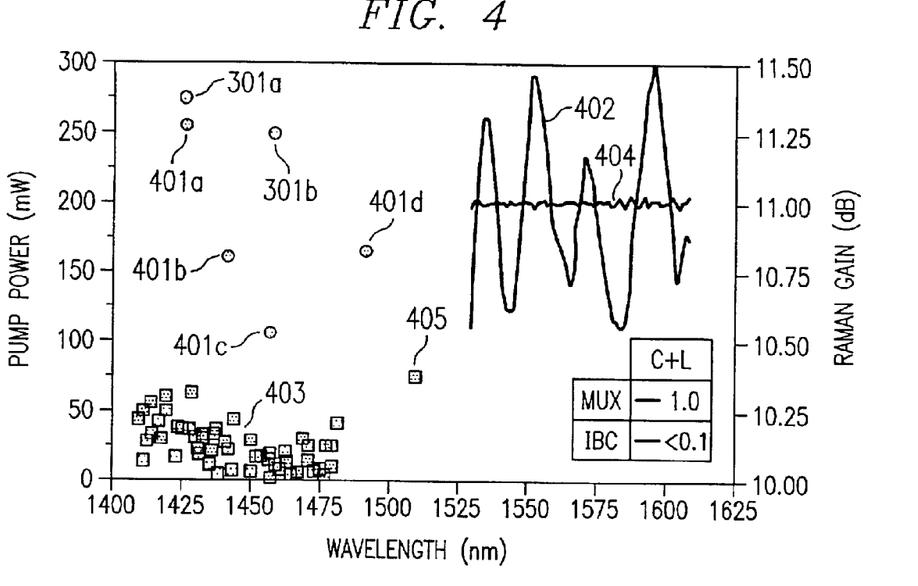
FIG. 4 depicts a Raman pump spectrum according to the prior art and a Raman pump spectrum according to an embodiment of the present invention with each of the Raman pump spectrums generating Raman gain across the C Band and L Band (1570 to 1610 nm)

FIG. 4 depicts the extension of C-Band Raman pump sources 301a and 301b and 303 to cover the C Band and L Band (1530–1610 nm). In this case, the powers of pumps 301a and 301b are reduced as reflected by 401a and 401c respectively. Two additional pumps, 401b and 401d, are added. This Raman pump spectrum provides Raman gain spectrum 402 across the C Band and L Band (1570 to 1610 nn). Raman gain spectrum 402 exhibits significant gain ripple across the gain spectrum. The difference between maximum and minimum Raman gain is approximately 1 dB.

FIG. 4 further depicts the extension of Raman pump spectrum 303 to cover the C and L Bands according to an embodiment of the present invention. Raman pump spectrum 403 may be generated by varying output power from a plurality of individually addressable emitters and adding one other single wavelength pump. Each of the emitters is forced to lase at a distinct wavelength. The wavelengths of the emitters are advantageously selected such that the emitters are spaced across a relatively broad spectrum. In this case, the aggregate output spectrum spans approximately 100 nm (from approximately 1410 to 1510 nm). Each of the emitters operates at a relatively low output power. Raman gain spectrum 404 depicts the Raman gain across the C Band and L Band that results from Raman pump spectrum 403 and 405. Raman gain spectrum 404 exhibits far less gain ripple as compared to Raman gain spectrum 402. The difference between the maximum and minimum amplification associated with Raman gain spectrum 404 is less than 0.1 dB.

It shall be appreciated that such an arrangement of emitters, for generating either Raman pump spectrum 303 and 403, can be implemented by utilizing an incoherently beam combined (IBC) laser configuration as will be discussed in greater detail below. It shall further be appreciated that Raman pump spectrums 303 and 403 are exemplary and other pump spectrums can be utilized in accordance with embodiments of the present invention.

Figure 5:
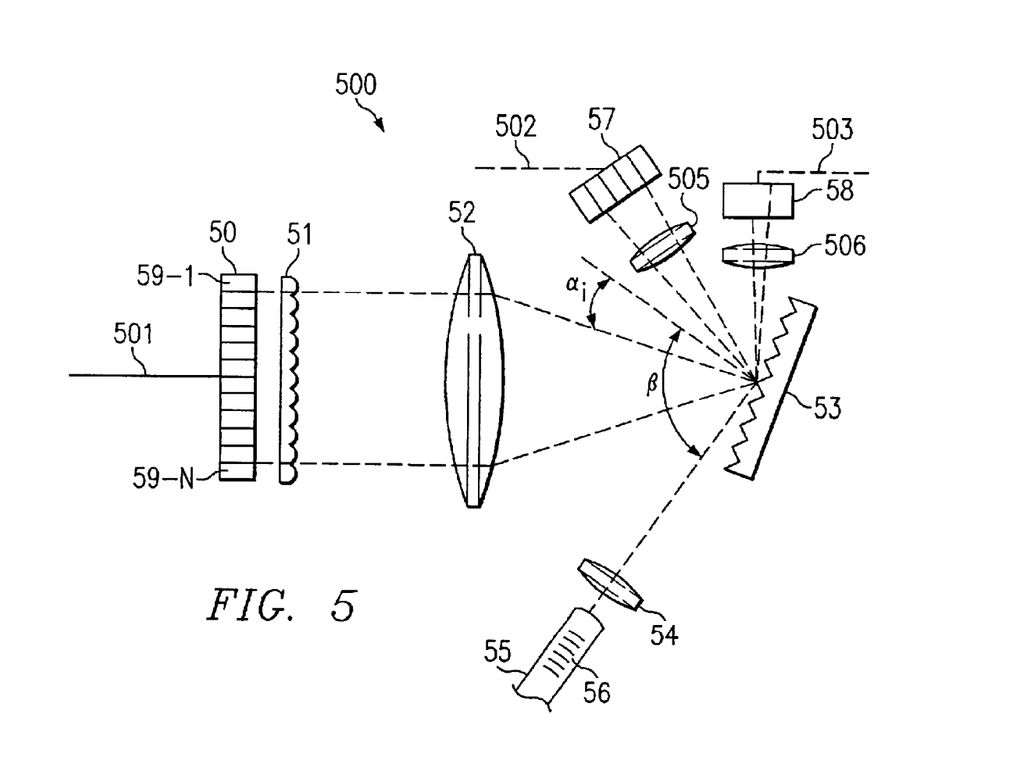
FIG. 5 depicts an exemplary incoherently beam combined laser according to an embodiment of the present invention.

FIG. 5 depicts IBC laser 500 which can be adapted to produce a tailored Raman pump spectrum such as Raman pump spectra 303 and 403. IBC laser 500 is shown as incorporating emitter device 50. Emitter device 50 comprises a plurality of emitters 59-1 through 59-N. Emitters 59-1 through 59-N are gain elements (typically consisting of semiconductor material, such as GaAlAs, GaAs, InGaAs, InGaAsP, AlGaInAs, and/or the like) which are capable of lasing at particular wavelengths. Any number of designs may be utilized for emitters 59-1 through 59-N including, but not limited to, edge emitters, vertical cavity surface emitting lasers (VCSELs), and grating surface emitting lasers. Accordingly, the term "emitter" is intended to mean any optical gain material or element capable of lasing in response to feedback.

Emitter device 50 is coupled to electrically conducting cable 501. Cable 501 provides a plurality of current lines to couple emitters 59-1 through 59-N to a plurality of current sources (not shown) to variably drive emitters 59-1 through 59-N. The number of lines and current sources depends on the number of addressable emitters and whether emitters 59-1 through 59-N are individually addressable or whether emitters 59-1 through 59-N are addressable in blocks. Suitable emitter structures which may be utilized to implement emitter device 50 are disclosed in co-assigned and co-pending U.S. patent application Ser. No. 09/945,381, filed Aug. 31, 2001, entitled "SYSTEM AND METHOD FOR PROVIDING A SPECTRALLY TAILORED RAMAN PUMP," which is incorporated herein by reference.

The external cavity of IBC laser 500 includes micro-optic 51, collimating optic 52, diffraction grating 53, fiber coupling lens 54, and fiber Bragg grating 56 which is embedded inside optical fiber 55.

The light emitted from emitters 59-1 through 59-N is partially collimated by micro-optic 51 which may be implemented as an array of micro-lenses utilizing photolithographic techniques. The partially collimated light is then further collimated by collimating optic 52 (e.g., a lens) such that the chief rays of the beams from individual emitters 59-1 through 59-N intersect or spatially overlap on diffraction grating 53. The beams are then diffracted in the first order by diffraction grating 53 thereby multiplexing the beams. The multiplexed beams are coupled into optical fiber 55 by fiber coupling lens 54. Fiber Bragg grating 56 provides a partially reflective surface that returns feedback to emitters 59-1 through 59-N.

It shall be appreciated that the geometry of the external cavity of IBC laser 500 defines the resonant wavelengths of emitters 59-1 through 59-N. The center wavelength ($\lambda_i$) of the wavelengths fed back to the $i^{th}$ emitter 59-$i$ is given by the equation: $\lambda_i = A[\sin(\alpha_i) + \sin(\beta)]$, where A is the spacing between adjacent rulings on diffraction grating 53, $\alpha_i$ is the angle of incidence of the light from the $i^{th}$ emitter on diffraction grating 53, and $\beta$ is the output angle which is common to all emitters 59-1 through 59-N. Since the feedback to each emitter 59-$i$ varies according to its position on the array, a relatively broad spectrum of output light can be generated by IBC laser 500. Additionally, the ability to combine the output beams incoherently from a number of emitters 59-1 through 59-N allows IBC laser 40 to achieve a relatively high output power.

In addition, zero order diffraction beams are produced by the zero order diffraction of the output beams from emitters 59-1 through 59-N by diffraction grating 53. The zero order diffraction beams are focused by lens 505 onto linear detector array 57, such that each output beam from 59-1 to 59-N corresponds to a particular element of linear detector array 57. Linear detector array 57 allows the output power of each emitter 59-1 through 59-N to be determined. Linear detector array 57 is coupled to cable 502 to provide power information to a control unit as will be discussed in greater detail herein below.

Following the feedback path, other zero order diffraction beams are produced by the zero order diffraction of the feedback light (i.e. the light reflected by fiber Bragg grating 56) by diffraction grating 53. The zero order diffraction beams are focused by lens 506 onto detector 58. Accordingly, detector 58 allows the amount of optical power that is coupled into, optical fiber 55 to be determined. Detector 58 is coupled to cable 503 to provide power information to a control unit.

Although IBC laser 500 utilizes diffraction grating 53 and collimator 52 to provide feedback to emitters 59-1 through 59-N and to multiplex their output beams, other feedback and multiplexing elements can be substituted such as arrayed waveguide gratings and Mach-Zehnder interferometers. In addition, transmission diffraction gratings, prisms, holograms, and other dispersive elements can be utilized in lieu of reflective diffraction grating 53. The particular dispersive element used in a given application will influence the geometry of the external cavity.

By selecting the various characteristics defining the external cavity of IBC laser 500, the center wavelengths of emitters 59-1 through 59-N can be advantageously achieved. The wavelengths can be selected to span any particular pump spectrum for a given application. Additionally, emitters 59-1 through 59-N may be operated to achieve the desired power levels via provision of drive current via lines associated with cable 501. By controlling the wavelengths and output power of emitters 59-1 through 59-N, IBC laser 500 can be utilized to provide a dynamically spectrally tailored Raman pump.

Also, it shall be appreciated that it can be advantageous for certain application to use non-uniform spacings between emitters 59-1 through 59-N. Variation of emitter spacings can create greater spectral power density over certain spectral portions. Specifically, the emitter spacings can be relatively smaller for emitters associated with the blue side of the Raman pump spectrum than for the emitters associated with the red side of the Raman pump spectrum. By modifying the emitter spacings, more power may be allocated to the blue side of the spectrum due the feedback arrangement of IBC laser 500.

Figure 6:
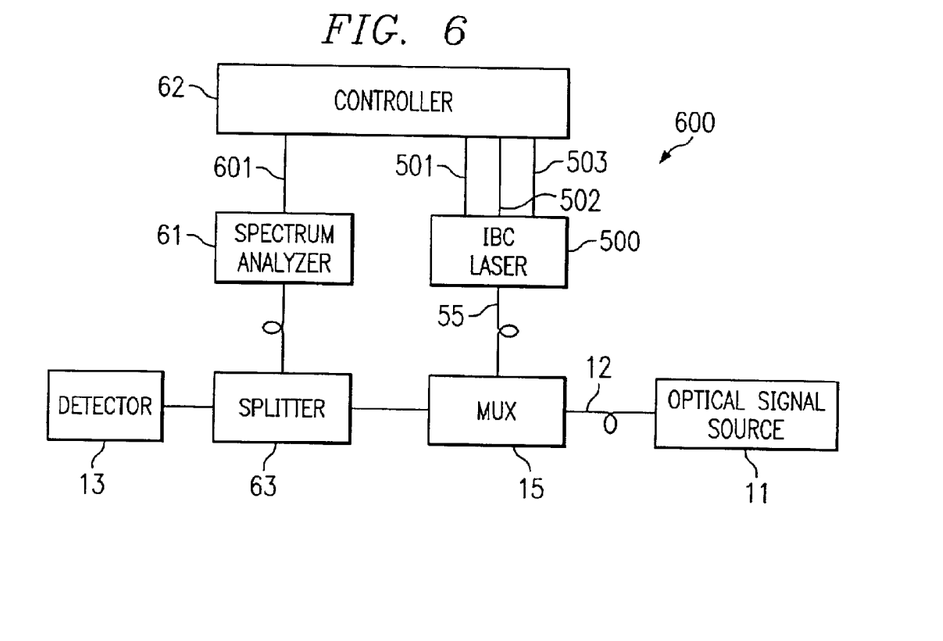
FIG. 6 depicts an exemplary optical communication system according to an embodiment of the present invention.

FIG. 6 depicts exemplary optical system 600 which includes IBC laser 500 to produce a dynamically spectrally tailored Raman pump to maintain Raman gain flatness. IBC laser 500 is coupled to controller 62 via cables 501, 502, and 503. Controller 62 controls the output power of emitters 59-1 through 59-N (see FIG. 5) by providing variable current via the lines of cable 501. Additionally, controller 62 receives the power feedback information from cables 502 and 503. Controller 62 is able to determine the output power of each emitter 59-1 through 59-N and the amount of optical power coupled into optical fiber 55. Additionally, optical signal source 11 provides an optical signal to optical fiber 12. The Raman pump generated by IBC laser 500 is provided to optical fiber 12 via multiplexer 15 to generate the desired Raman gain. Multiplexer 15 is coupled to splitter 63. Splitter 63 allows a portion of the amplified optical signal that originated from optical signal source to be provided to spectrum analyzer 61. Spectrum analyzer 61 analyzes the spectral content of the amplified optical signal. The spectral information is provided to controller 62 via cable 601. Utilizing the power information from cables 502 and 503 and the spectral information from cable 601, controller 62 varies the drive currents to emitters 59-1 through 59-N as necessary to maintain Raman gain flatness. Controller 62 varies the drive currents according to suitable control algorithms as will be discussed in greater detail herein below.

Figure 7:
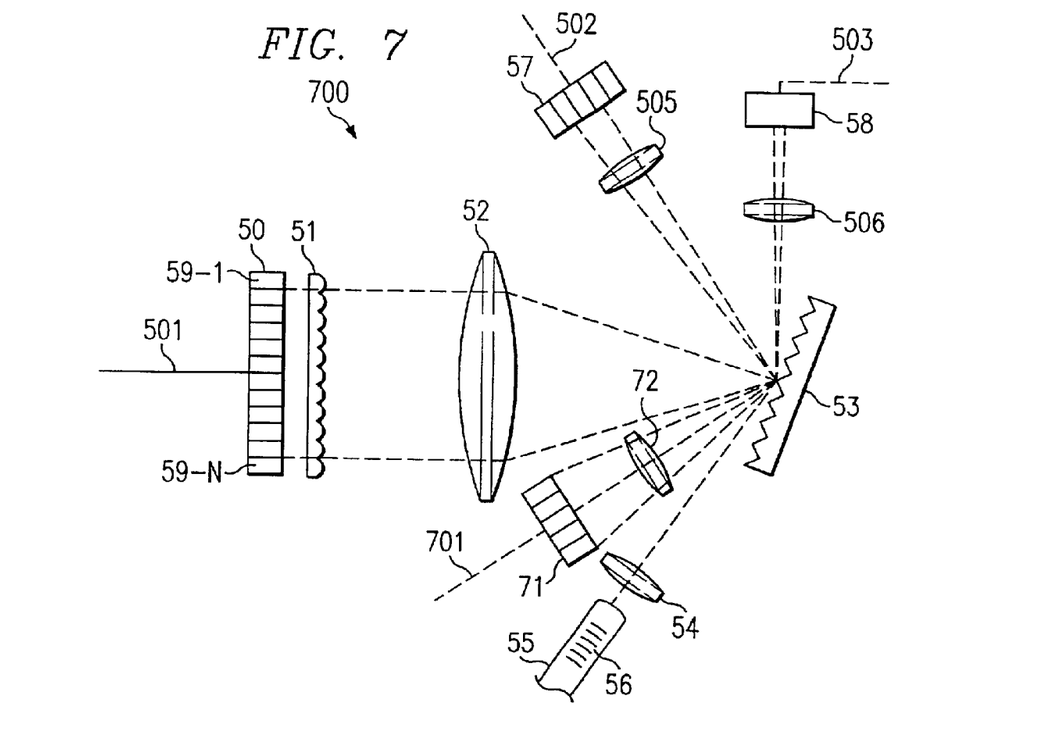
FIG. 7 depicts another exemplary incoherently beam combined laser according to an embodiment of the present invention.
Figure 8:
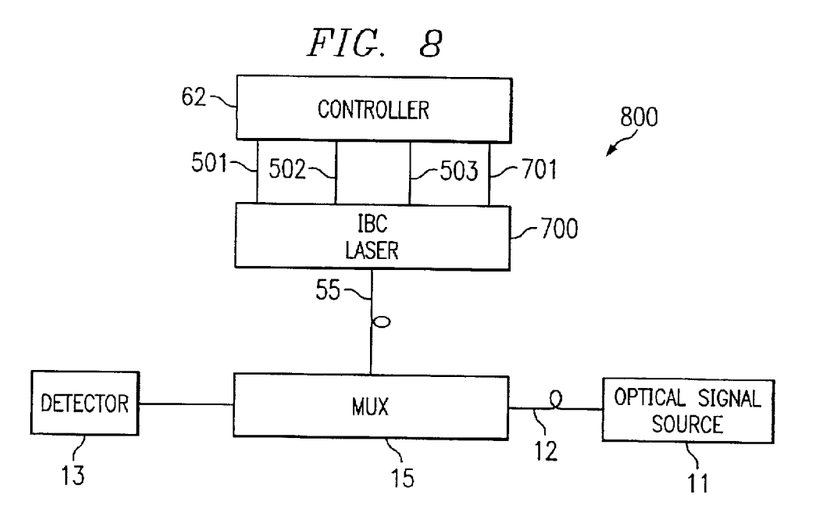
FIG. 8 depicts another exemplary optical communication system according to an embodiment of the present invention.

FIG. 7 depicts another IBC laser configuration. IBC laser 700 possesses a configuration that is similar to the configuration of IBC laser 500. However, IBC laser 700 comprises a second linear detector array 58. It shall be appreciated that a portion of power of the optical signal being amplified is provided to the external cavity of IBC laser 700 via optical fiber 55 in a Raman amplifier configuration such as depicted in FIG. 8. The spectral content of the optical signal being amplified may be analyzed by examining, for example, its first order diffraction beams generated by diffraction element 53. IBC laser 700 focuses the first order diffraction beams via lens 72 onto linear detector array 71. Linear detector array 71 is coupled to cable 701 to provide spectral information concerning the signal being amplified to controller 62.

It shall be appreciated that the schematic depictions of IBC laser 500 and IBC laser 700 in FIGS. 5 and 7 do not represent strictly accurate ray tracing diagrams of the respective configurations. FIGS. 5 and 7 are intended to provide sufficient detail to aid the reader's understanding of embodiments of the present invention.

FIG. 8 depicts exemplary optical system 800 which includes IBC laser 700 to produce a dynamically spectrally tailored Raman pump to maintain gain flatness. Optical system 800 is substantially similar to optical system 600. However, optical system 800 does not include spectrum analyzer 61 or splitter 63. In lieu thereof, controller 62 receives spectral information related to the amplified optical signal in optical fiber 12 through optical fiber 55 of IBC laser 700 via cable 701.

Figure 9:
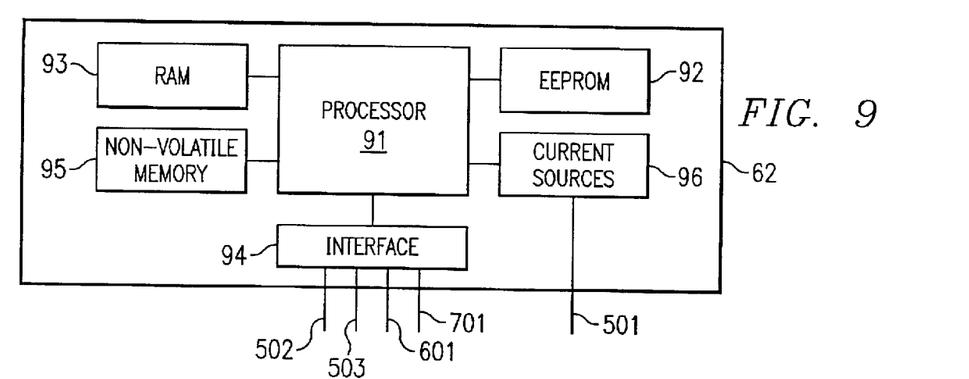
FIG. 9 depicts an exemplary controller device according to an embodiment of the present invention.

FIG. 9 depicts an exemplary embodiment of controller 62. Controller 62 includes processor 91 which executes executable code stored on EEPROM 92. Controller 62 also includes interface 94. Interface 94 provides a physical interface for the various cables (e.g., 501, 502, 503, and 601 or 701). Interface 94 can include any appropriate hardware and/or software to allow processor 91 to receive information from cables 502, 503, 601, and/or 701. Interface 94 can also include any appropriate hardware and/or software to receive power information from processor 91 to drive emitters 59-1 through 59-N (see FIG. 5) via the lines of cable 501. For example, interface 94 may comprise a number of analog to digital (A/D) converters and digital to analog (D/A) converters. Interface 94 may also include a bus to facilitate communication of pertinent information to processor 91. Processor 91 can also utilize random access memory (RAM) 93 to store pertinent information and to perform calculations according to control algorithms as will discussed in greater detail below. Controller 62 may further include non-volatile memory 95 (e.g., disk drive, tape drive, optical drive, and/or the like). Processor 91 can store certain Raman gain spectra in non-volatile memory 95 to implement a learning algorithm as will be discussed in greater detail below. Controller 62 also contains current sources 96 to provide variable power to emitters 59-1 to 59-N via cable 501. It shall be appreciated that this embodiment of controller 62 is exemplary. Any number of appropriate configurations may be utilized. Any suitable processor based device or control logic based device (e.g., an application specific integrated circuit) can be utilized as desired for a particular application, so long as the device is capable of performing suitable control algorithms as will be discussed in greater detail below.

It shall be appreciated that Raman gain can vary due to any number of factors. As previously noted, Raman gain is affected by self-amplification of the Raman pump. Also, Raman gain is affected by the signal wavelengths being amplified. For example, a Raman pump may provide optical gain for a number of channels in a WDM or DWDM optical communication system. The optical communication system may at one time communicate ten channels over a given optical fiber. At another time, the optical communication system may communicate twenty channels over the same optical fiber. If the Raman pump is unaffected, the Raman gain produced in the optical fiber will vary due to the presence of additional channels. Also, Raman gain produced in the optical fiber can vary if the number of channels remains the same. Specifically, if the power level in the wavelengths utilized to carry channels varies, the Raman gain will also vary.

In response to system variations in Raman gain and Raman gain flatness in a Raman amplifier, a number of dynamic control algorithms can be utilized. In one embodiment of the present invention, processor 91 of controller 62 actuates changes in current supplied to emitters 59-1 through 59-N through cable 501 to measure accompanying changes in the power of signal wavelengths through input cable 601 and/or 701. Processor 91 utilizes the resulting changes in the power of signal wavelengths to determine optimal currents to achieve reasonably flat Raman gain.

Pursuant to this embodiment, each emitter 59-i of a plurality of emitters is respectively supplied with the current $I_i$ by current sources 96. The power in the $j^{th}$ signal wavelength is $P_j$ at the end of the amplification span. From this state, the relationship between a change in emitter currents and the resulting change in power of the signal wavelengths is assumed to be governed by the following matrix relationship:

$$\delta_{ji}\Delta I_i = \Delta P_j,$$

where $\Delta I_i$ is the change in current applied to emitters, $\Delta P_j$ is the resulting power level change in each of the signal wavelengths, and $\delta_{ji}$ is the differential gain matrix.

According to this embodiment, the differential gain matrix, $\delta_{ji}$, is determined. Specifically, the current to each emitter 59-$i$ is individually varied by a small amount, $\Delta I_i$. The resulting change in power, $\Delta P_j$, for each signal wavelength is measured each time that current is varied for an individual emitter 59-$i$. The information gathered in this manner is used to generate the differential gain matrix, $\delta_{ji}$. The differential gain matrix, $\delta_{ji}$, provides the relationship between the change in signal wavelength power that results from any change in emitter currents. It shall be appreciated that the differential gain matrix, $\delta_{ji}$, is not typically a square matrix, since the number of emitters 59-$i$ does not necessarily equal the number of signal wavelengths.

After building the differential gain matrix, $\delta_{ji}$, the desired change in power for each signal wavelength is determined that will result in reasonably flat Raman gain. This can be determined by measuring the deviation of power of each signal wavelength from a desired power. The desired change in power for each signal wavelength is represented by $\Delta P_j'$. Obtaining reasonably flat Raman gain involves minimization of the vector norm, where the vector norm is given by:

$$\rho = \|\delta_{ji}\Delta I_i - \Delta P_j'\|.$$

By finding the inverse of the differential gain matrix, $\delta_{ji}$, the required change in emitter currents that results in the desired change in signal wavelength power can be determined. The solution can be obtained by finding the generalized (or pseudo) inverse, $\delta_{ji}^{-1}$, by singular-value decomposition (SVD). See *Numerical Recipes,* Press et al., p. 52 (1986). Then the minimum norm solution of the least-squares problem is:

$$\Delta I_i = \delta_{ij}^{-1}\Delta P_j',$$

which provides the change in emitter currents that will result in the desired change in signal wavelength power.

In other embodiments, the changes in emitter currents are determined by perturbing the emitter currents and measuring resultant changes in wavelength power while applying a PID algorthim, which is known in the art. Further details regarding PID are described in the reference by Benjamin C. Kuo entitled *Automatic Control Systems,* $4^{th}$ ed. (1982). PID performs weighted proportionality integral and derivative calculations. In particular, the integral component or calculation of the PID algorithm stabilizes controller effects by providing memory to the algorithm.

To describe PID, it is convenient to define a new set of parameters. $<G_j>$ is the desired gain for wavelength j. $G_j$ is the measured gain for a wavelength, j. The differential gain matrix, $\delta_{ji}$, provides the relationship between the change in signal wavelength power that results from any change in emitter currents as discussed above.

An error function, $\Delta G_{jk}$ for wavelength j at time step k is defined by:

$$\Delta G_{jk} = \epsilon P_{jk} + \epsilon I_{jk} + \epsilon D_{jk};$$

where $\epsilon P_{jk} = K_P(G_{jk} - <G_j>)$; $\epsilon I_{jk} = K_I[\Sigma G_{jm} - <G_j>]$ wherein the summation is indexed by m and occurs from 1 to k; and $\epsilon D_{jk} = K_D(G_{jk} - G_{j(k-1)})$. The controller weights $K_P$, $K_I$, and $K_D$ may be adjusted with a "fuzzy" rule-based controller. Other options include a neural-network adaptive system or a Kalman filter approach for autonomous learning.

The changes, $\Delta I_{ik}$, in emitter currents, at time k, are determined by:

$$\Delta I_{ik} = \delta_{ij}^{-1}(-\Delta G_{jk}).$$

It shall be appreciated that the preceding matrix algorithm is not limited to utilizing emitter current. Instead, the optical output power of emitters may be measured directly by a suitable optical detector such as linear detector array 57 of FIG. 5. A gain matrix may be built to relate a change optical output power of the emitters to a change in wavelength power. Additionally, it shall be appreciated that the preceding matrix algorithm does not require measurement of every wavelength associated with communication channels over a given spectrum. Instead, wavelength power information can be gathered for a subset of wavelengths across the given spectrum.

In another embodiment, processor 91 of controller 62 implements a learning algorithm to perform dynamical tailoring of a Raman pump to maintain gain flatness. In general, learning algorithms employ training examples to generate a plurality of weights or coefficients as is well known in the art. The plurality of weights is utilized to generate an output or result. The output is evaluated to determine its deviation from a desired result. The evaluation is utilized to refine the plurality of weights. For example, a least mean square method to refine the plurality of weights can be utilized. Additional information concerning learning algorithms can be located in *An Introduction to Computational Learning,* Kearns, M. J., et al. (1994). According to this embodiment, a learning algorithm can be applied to minimally vary the Raman pump spectrum to a solution that provides the minimum Raman gain ripple for a particular signal wavelength spectrum. Solutions for particular signal wavelength spectrums can be stored in memory to facilitate pattern matching aspects of the leaning algorithm.

Figure 10:
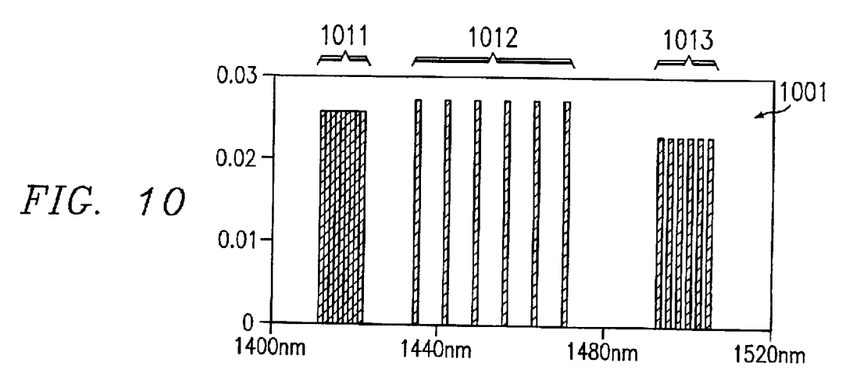
FIG. 10 depicts an exemplary Raman pump spectrum according to an embodiment of the present invention.

In another embodiment, processor 91 of controller 62 may systematically vary gain over a number of combinations of emitter currents to determine the most advantageous combination of currents to apply to emitters 59-1 through 59-N. In particular, this embodiment can be advantageously employed with a block addressable scheme as depicted in FIG. 10. FIG. 10 depicts Raman pump spectrum 1001 generated by operating blocks of emitters at a similar power level by coupling each block to a respective current source. In this case, three individually addressable blocks of emitters are utilized. The outputs from the three blocks of emitters are depicted as pump spectral portions 1011, 1012, and 1013. It shall be appreciated that such an arrangement of emitters may be achieved by utilizing an incoherently beam combined (IBC) laser configuration. It shall further be appreciated that the emitter power space defined by the possible current combinations is substantially reduced, because three current sources are utilized. Thus, iteration through a significant proportion of possible current patterns is practical within a limited amount of time.

Although this embodiment may operate through brute force by applying each possible current combination, it is advantageous to employ an algorithm to converge to an optimal current pattern. For example, three blocks of emitters can be utilized with each block of emitters being designed to be driven by $2^q$ different current levels. An iterative algorithm may divide the possible current levels into a smaller subset of current levels (e.g., $2^q/4$, $2^q/2$, and $3*2^q/4$). Each current combination within this subset can be applied to the emitters. The resulting power levels of the signal wavelengths that result from the attendant Raman gain can be measured for each combination. The best combination (designated as $P_1$, $P_2$, and $P_3$) can be selected for the next iteration. The next iteration of the algorithm can vary current levels around $P_1$, $P_2$, and $P_3$ by a more restricted subset. For example, the next iteration may apply current levels that deviate from $P_1$, $P_2$, and $P_3$ by 0, $\pm 2^q/4$, and $\pm 2^q/8$. Again, the power levels of the signal wavelengths can be measured to determine the best combination present in the subset of current combinations. This algorithm can continue iterating by utilizing the best combination from the previous iteration and utilizing more restrictive current deviations, until an optimal current combination is determined.

By utilizing embodiments of the present invention, suitable structures can be employed to provide spectral information as feedback to suitable control algorithms to maintain reasonably flat Raman gain. Specifically, embodiments of the present invention may monitor spectral information associated with signal wavelengths. When Raman gain associated with the signal wavelengths becomes uneven, suitable control algorithms can be employed to equalize Raman gain across the signal wavelengths. In addition, the use of an IBC laser configuration allows reasonably flat Raman gain to be dynamically achieved across a broad spectrum of wavelengths. Embodiments of the present invention are capable of dynamically maintaining reasonably flat Raman gain across any of the C Band (1530 to 1565 nm), L Band (1570 to 1610 nm), S Band (1480 to 1525 nm), and XL Band (1615 to 1660 nm). Additionally, embodiments of the present invention provide control structure to determine the amount of power to be coupled into an optical fiber by a Raman pump source. To facilitate suitable control algorithms, embodiments of the present invention also allow the amount of optical power actually generated by each emitter of an IBC laser to be determined.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed as new and desired to be protected by Letters Patent of the United States is:

1. A method for providing a dynamically spectrally tailored Raman pump, said Raman pump generating Raman gain for a plurality of signal wavelengths, said method comprising the steps of:

driving a plurality of gain elements utilizing a plurality of current sources, each current source of said plurality of current sources driving at least one gain element of said plurality of gain elements by a variable current, wherein each of said plurality of gain elements generates a spectrally distinct output;

combining outputs from said plurality of gain elements to generate said Raman pump that comprises a plurality of spectral components:

providing said Raman pump to an optical medium to generate Raman gain for said plurality of signal wavelengths;

determining power levels associated with said plurality of signal wavelengths; and adjusting variable currents of said plurality of current sources utilizing in part said power levels associated with said plurality of signal wavelengths wherein said adjusting causes dynamic spectral tailoring of said Raman pump.

2. The method of claim 1 wherein said step of providing a plurality of gain elements includes providing an external cavity, comprising a plurality of optical components, that provides feedback to said plurality of gain elements and to combine output beams from said plurality of gain elements to form said Raman pump.

3. The method of claim 2 wherein said external cavity comprises:

a collimating optical assembly that collimates beams from said plurality of gain elements;

a dispersive element that spectrally separates beams after collimation by said collimating optical assembly; and a partial reflector providing feedback after spectral separation by said dispersive element.

4. The method of claim 3 wherein said partial reflector is embedded in an optical fiber, wherein said external cavity further comprises:

a focusing lens focusing an output beam into said optical fiber.

5. The method of claim 4 wherein said dispersive element is selected from the list consisting of:

reflective diffraction grating;

transmission diffraction grating;

prism; and hologram.

6. The method of claim 3 further comprising the step of:

adjusting divergence of each output beam from said plurality of gain elements.

7. The method of claim 6 wherein said step of adjusting divergence is performed by an array of micro-lenses.

8. The method of claim 1 further comprising:

initiating respective current changes to selected ones of said plurality of gain elements; and measuring resulting changes in power levels associated with said plurality of signal wavelengths for each respective current change to selected ones of said plurality of gain elements.

9. The method of claim 8 further comprising:

building a differential gain matrix, wherein said differential gain matrix relates a change in power levels associated with said plurality of signal wavelengths to a change in power associated with plurality of gain elements.

10. The method of claim 8 further comprising the step of:

inverting said differential gain matrix to produce an inverted matrix.

11. The method of claim 10 further comprising the step of:

multiplying said inverted matrix by a desired power level change vector.

12. The method of claim 1 further comprising the step of:

storing patterns of current levels to support a computational learning algorithm, said computational learning algorithm repetitively refining control coefficients in response to said stored patterns of current levels, wherein said adjusting is performed using said control coefficients from said computational learning algorithm.

13. The method of claim 1 further comprising:

applying a number of current combinations to said plurality of current sources to determine optimal current levels.

14. A system for providing Raman gain to a plurality of signal wavelengths, comprising:

a plurality of gain elements producing output beams;

a collimating optic focusing said output beams on a dispersive element;

said dispersive element combining said output beams as a Raman pump that comprises a plurality of spectral components;

a Raman amplifier receiving said Raman pump for amplifying said plurality of signal wavelengths; and a controller device causing said plurality of gain elements to operate at variable power levels in response to received information indicative of Raman gain produced by said Raman pump on said plurality of signal wavelengths, wherein operation of said plurality of gain elements at variable power levels cause dynamic spectral tailoring of said Raman pump.

15. The system of claim 14 further comprising:

an array of micro-lenses adjusting divergence of said output beams from said plurality of gain elements.

16. The system of claim 14 further comprising:

an optical fiber;

a partial reflector reflecting a portion of said Raman pump as feedback for said plurality of gain elements, wherein said partial reflector is embedded in said optical fiber; and a fiber coupling lens for coupling said Raman pump into said optical fiber.

17. The system of claim 14 further comprising:

a spectrum analyzer determining power levels associated with said plurality of signal wavelengths and providing said information indicative of Raman gain to said controller device.

18. The system of claim 14 further comprising:

a linear detector array;

a focusing lens focusing beams of the plurality of signal wavelengths being amplified diffracted from said dispersive element onto said linear detector array to provide said information indicative of Raman gain to said controller device.

19. The system of claim 14 further comprising:

a partial reflector, said partial reflector partially reflecting said output beams toward said dispersive element as reflected beams;

said dispersive element producing zero order diffracted beams from said reflected beams;

a focusing element focusing said zero order diffracted beams onto a detector; and said detector providing information indicative of an amount of optical power coupled into said optical fiber to said controller device.

20. The system of claim 14 wherein said controller device includes means for varying said Raman pump to maintain substantially spectrally flat Raman gain.

21. The system of claim 20 wherein said means for varying said Raman pump includes means for building a differential gain matrix, wherein said differential gain matrix relates changes in power levels associated with said plurality of gain elements to changes in optical power at said plurality of signal wavelengths.

22. The system of claim 20 wherein said means for varying said Raman pump includes means for multiplying said differential gain matrix by desired signal wavelength power changes.

23. The system of claim 20 wherein said means for varying said Raman pump includes means for storing patterns of currents applied to said plurality of gain elements, said patterns of currents applied to said plurality of gain elements being generated by a computational learning algorithm.

24. The system of claim 20 wherein said means for varying said Raman pump includes means for applying a plurality of current combinations to said plurality of gain elements.

* * * * *